(12) United States Patent
di Matteo et al.

(10) Patent No.: US 8,470,633 B2
(45) Date of Patent: Jun. 25, 2013

(54) CIRCUIT ARCHITECTURE ON AN ORGANIC BASE AND RELATED MANUFACTURING METHOD

(75) Inventors: Andrea di Matteo, Naples (IT); Angela Cimmino, Casagiove (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 246 days.

(21) Appl. No.: 13/101,903

(22) Filed: May 5, 2011

(65) Prior Publication Data

US 2011/0275018 A1 Nov. 10, 2011

Related U.S. Application Data

(62) Division of application No. 12/060,651, filed on Apr. 1, 2008, now Pat. No. 7,960,722.

(30) Foreign Application Priority Data

Apr. 2, 2007 (IT) .............................. MI2007A0671

(51) Int. Cl.
*H01L 51/05* (2006.01)
(52) U.S. Cl.
USPC .......................................................... 438/82
(58) Field of Classification Search
USPC ................... 257/27, 40, E51.027; 438/82, 99
See application file for complete search history.

(56) References Cited

U.S. PATENT DOCUMENTS

2005/0058009 A1* 3/2005 Yang et al. ..................... 365/232
2007/0194301 A1* 8/2007 Sezi et al. ........................ 257/40

FOREIGN PATENT DOCUMENTS

WO 2005053027 A1 6/2005

* cited by examiner

*Primary Examiner* — Thomas L Dickey
(74) *Attorney, Agent, or Firm* — Seed IP Law Group PLLC

(57) ABSTRACT

A method comprises providing a bottom electrode, depositing, on the bottom electrode, an active material comprising a first structural portion having an absorption peak at a UV wavelength, wherein such first structural portion is photo-activatable at such wavelength and which is constituted by monomers or oligomers that, when irradiated at said wavelength, undergo a photo-polymerization and/or photo-cross-linking reaction, or constituted by a polymer that at a UV wavelength undergoes a photo-degradation reaction, and a second electrically active or activatable structural portion which is substantially transparent to such predetermined UV wavelength; exposing a portion of the active material, through a photomask, to UV radiation having such UV wavelength, with photo-activation of the exposed portion of such film; selectively removing either the exposed photo-activated portion or the non-exposed portion, with exposure of a respective portion of the bottom electrode; depositing a head electrode.

31 Claims, 20 Drawing Sheets

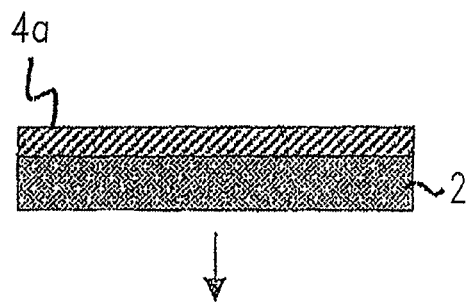
FIG. 1A
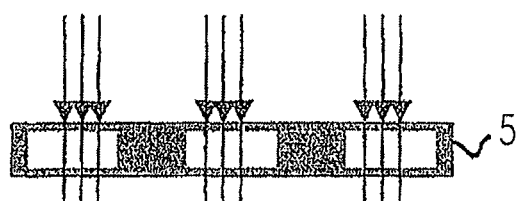
FIG. 1B
FIG. 1C
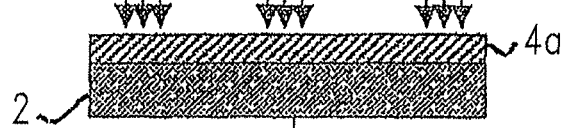
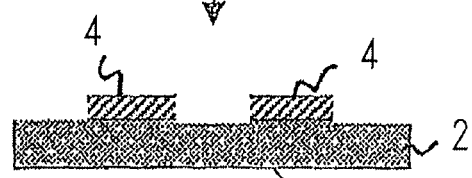
FIG. 1D

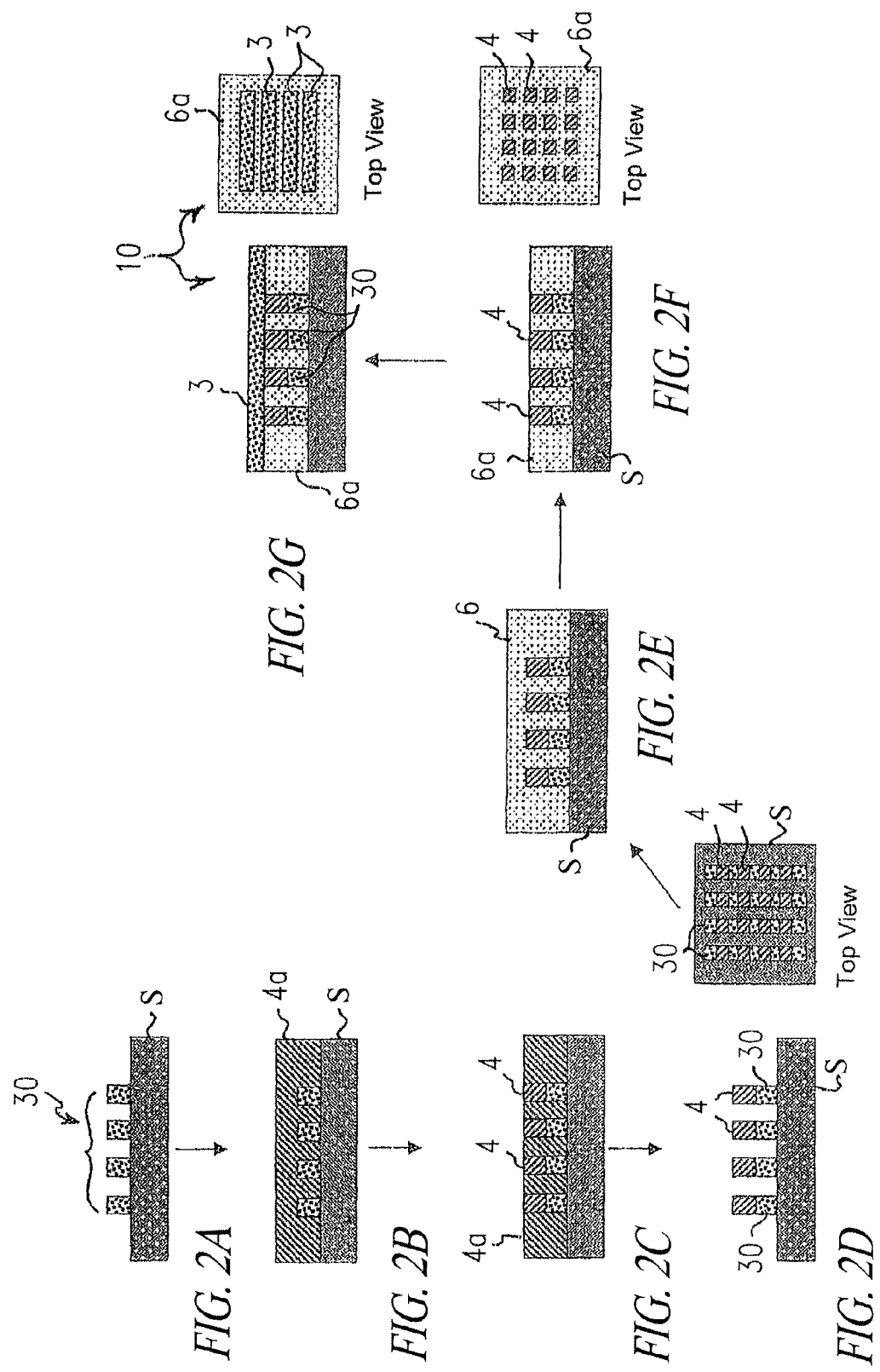

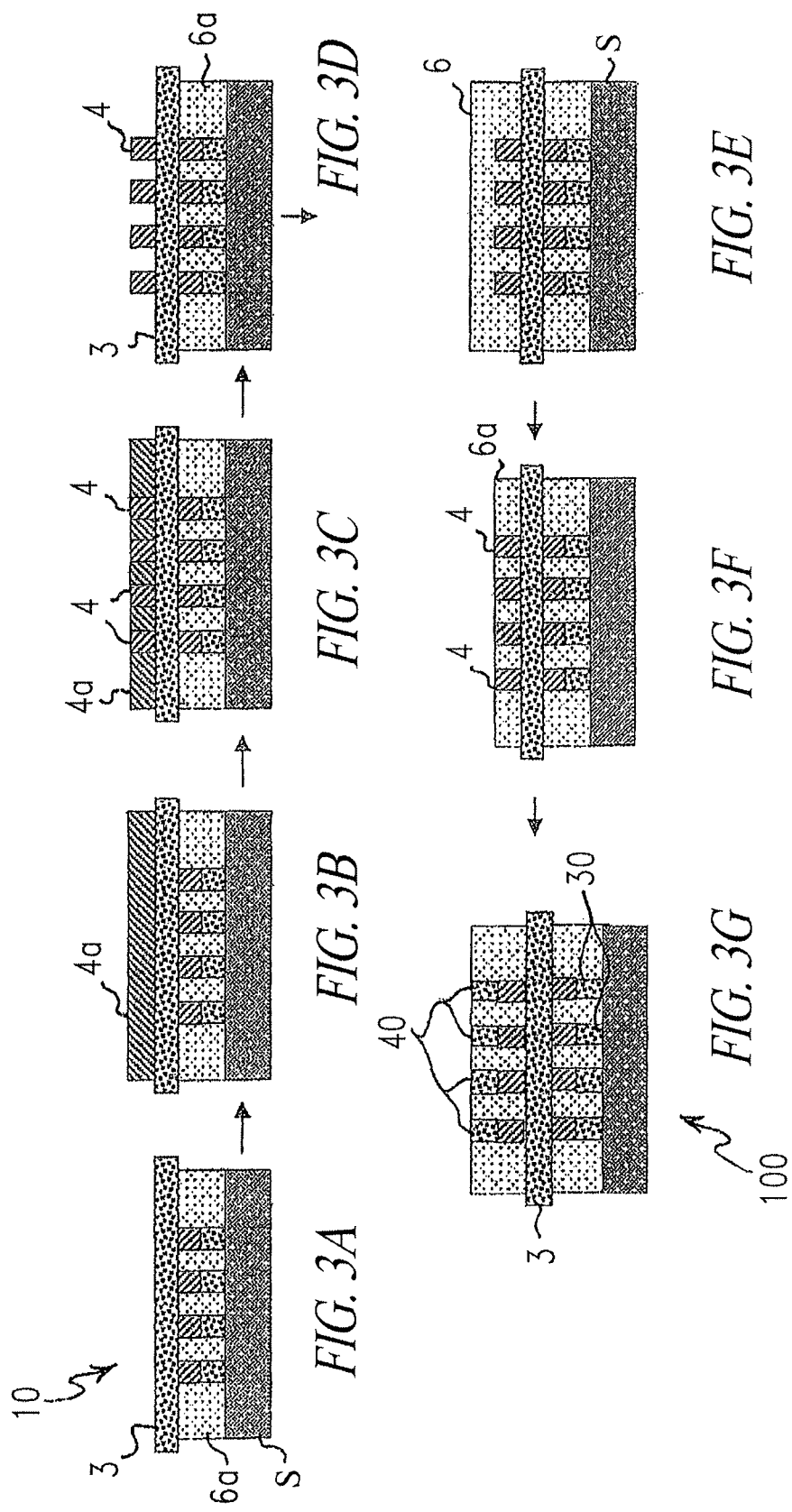

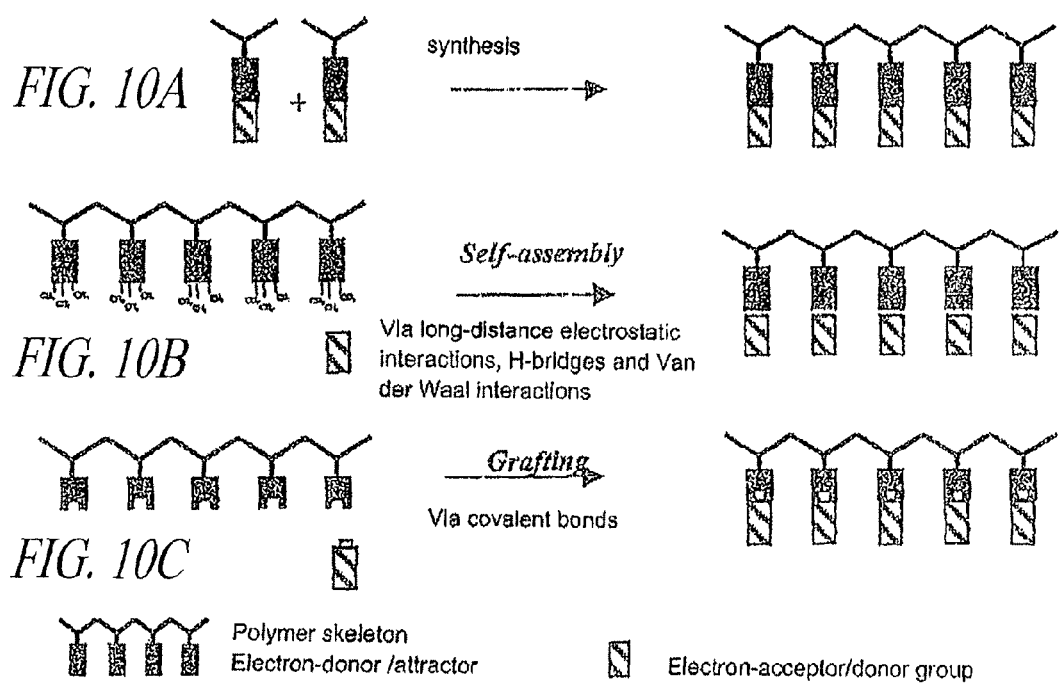

Fluorescein O, O' - dimethacrylate          Fluorescein O, O' - acrylate

Table 1. Molecular systems with electron acceptor character

| Acceptor Species | |
|---|---|
| Molecule | Derivatives |
| I-I, Br-Br, I-Cl, SbCl$_5$, AlCl$_3$, TiCl$_4$ | |
| TCNQ: 7,7,8,8, Tetracyanoquinodimethane | X= H, F, Cl, I, Br, R, OR, OCOR<br>Y= H, F, Cl, I, Br, R, OR, OCOR<br>Z= H, F, Cl, I, R, Br, OR, OCOR<br>W= H, F, Cl, I, R, Br, OR, OCOR<br>R = Generic alkyl, acrylic, allyl, acyl halide, amide group (gga)<br>All possible combinations |
| Tetracyanoethylene | |
| p-benzoquinone | X= H, F, Cl, I, Br, CN, R, OR<br>Y= H, F, Cl, I, Br, CN, R, OR<br>Z= H, F, Cl, I, R, Br, CN, OR<br>W= H, F, Cl, I, R, Br, CN, OR<br>R = (gga)<br>All possible combinations |
| (o-benzoquinone) | X= H, F, Cl, I, Br, CN, R, OR<br>Y= H, F, Cl, I, Br, CN, R, OR<br>Z= H, F, Cl, I, R, Br, CN, OR<br>W= H, F, Cl, I, R, Br, CN, OR<br>R = (gga)<br>All possible combinations |
| trinitrobenzene | |

*FIG. 12*

Table 1 (continuation)

Table 2. Molecular systems with electron donor character
| Donor species | |
|---|---|
| Molecule | Derivatives |
| 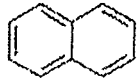 Naphthalene | 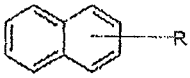 R= Generic alkyl, acrylic, allyl, acyl halide, amide group (gga) |
| 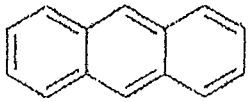 Anthracene | 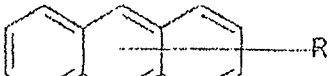 R=gga |
| 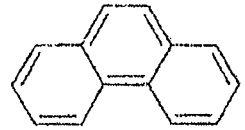 Phenanthrene | 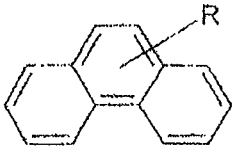 R=gga |
| 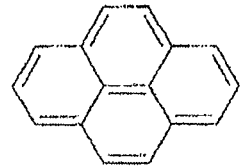 Pyrene | 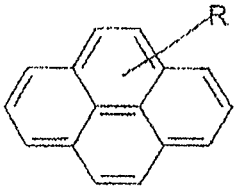 R=gga |
| 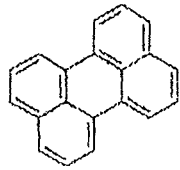 Perylene | 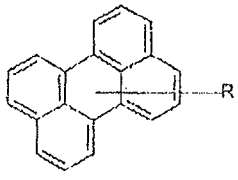 R=gga |
| 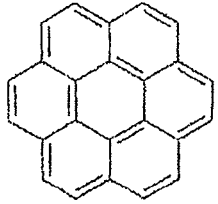 Coronane | 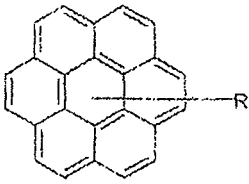 R=gga |
*FIG. 14*

Table 2. (continuation)
| | |
|---|---|
| 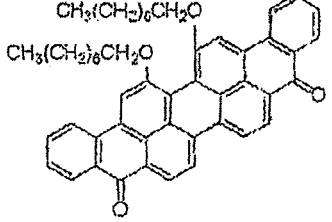 Violanthrone | |
|  Azulene | 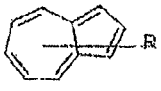 R=gga |
| 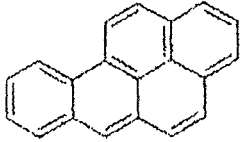 Benzopyrene α | 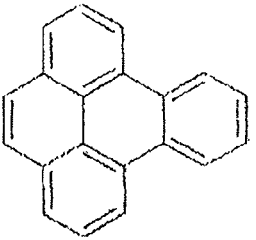 Isomers (for example benzopyrene β) 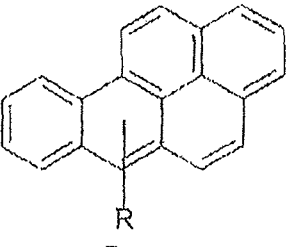 R=gga |
| 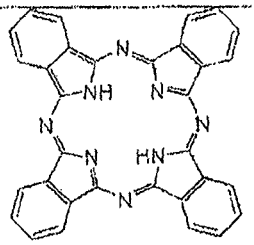 Phthalocyanine | Phthalocyanine and derivatives |
FIG. 15

Table 2. (continuation)
| | |
|---|---|
| Porphyrin 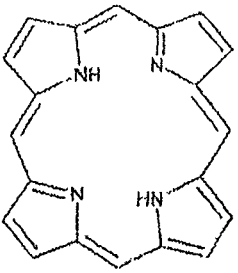 | Porphyrin and derivatives |
| β-Carotene 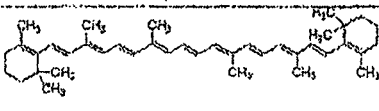 | |
| Crysene 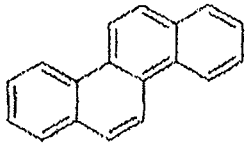 | 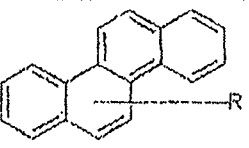 R=gga |
| $NH_3$ Ammonia | R3—N(R1)(R2) <br> R1=H, gga, O-gga <br> R2=H, gga, O-gga <br> R3=H, gga, O-gga |
| $NH_4^+$ Ammonium salt | R3—N⁺(R1)(R2)—R4 <br> R1=H, gga <br> R2=H, gga <br> R3=H, gga <br> R3=H, gga |
| Aniline  | 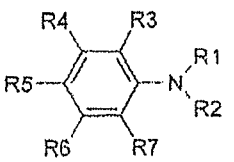 <br> R1=H, gga, O-gga <br> R2=H, gga, O-gga <br> R3=H, gga, O-gga <br> R4=H, gga, O-gga <br> R5=H, gga, O-gga <br> R6=H, gga, O-gga <br> R7=H, gga O-gga |
*FIG. 16*

Table 2. (continuation)

| | |
|---|---|
| H₂N—⟨⟩—NH₂<br>p-phenyldiamine | structure with R1–R8<br>R1=H, gga, O-gga<br>R2=H, gga, O-gga<br>R3=H, gga, O-gga<br>R4=H, gga, O-gga<br>R5=H, gga, O-gga<br>R6=H, gga, O-gga<br>R7=H, gga, O-gga |
| H₂N—⟨⟩—⟨⟩—NH₂<br>benzide | structure with R1–R12<br>R1=H, gga, O-gga<br>R2=H, gga, O-gga<br>R3=H, gga, O-gga<br>R4=H, gga, O-gga<br>R5=H, gga, O-gga<br>R6=H, gga, O-gga<br>R7=H, gga, O-gga<br>R8=H, gga, O-gga<br>R9=H, gga, O-gga<br>R10=H, gga, O-gga<br>R11=H, gga, O-gga<br>R12=H, gga, O-gga |
| H₂N—⟨⟩—NH—⟨⟩—NH₂<br>4,4'-diaminodiphenylamine | structure with R1–R13<br>R1=H, gga, O-gga<br>R2=H, gga, O-gga<br>R3=H, gga, O-gga<br>R4=H, gga, O-gga<br>R5=H, gga, O-gga<br>R6=H, gga, O-gga<br>R7=H, gga, O-gga<br>R8=H, gga, O-gga<br>R9=H, gga, O-gga<br>R10=H, gga, O-gga<br>R11=H, gga, O-gga<br>R12=H, gga, O-gga<br>R13=H, gga, O-gga |

FIG. 17

Table 2 (continuation)

| 4,4'-methylenedianiline | R1=H, gga, O-gga<br>R2=H, gga, O-gga<br>R3=H, gga, O-gga<br>R4=H, gga, O-gga<br>R5=H, gga, O-gga<br>R6=H, gga, O-gga<br>R7=H, gga, O-gga<br>R8=H, gga, O-gga<br>R9=H, gga, O-gga<br>R10=H, gga, O-gga<br>R11=H, gga, O-gga<br>R12=H, gga, O-gga<br>R13=H, gga, O-gga |
|---|---|
| 1-amino naftalene | R1=H, gga<br>R2=H, gga |
| 2-amino naftalene | R1=H, gga<br>R2=H, gga |
| 1,5-di-amino naftalene | R1=H, gga<br>R2=H, gga<br>R3=H, gga<br>R4=H, gga |
| 2,3 di-amino naftalene | R1=H, gga, O-gga<br>R2=H, gga, O-gga<br>R3=H, gga, O-gga<br>R4=H, gga, O-gga |

*FIG. 18*

Table 2. (continuation)
| | |
|---|---|
| 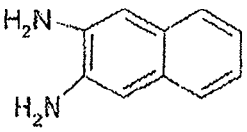 2,3 di-amino naftalene | 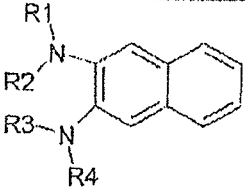<br>R1=H, gga, O-gga<br>R2=H, gga, O-gga<br>R3=H, gga, O-gga<br>R4=H, gga, O-gga |
|  Pyridine | 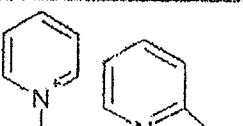<br>R: H, gga, O-gga |
| 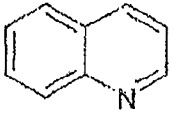 Quinoline | 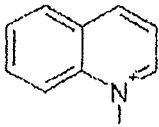<br>R= H, gga, O-gga |
| 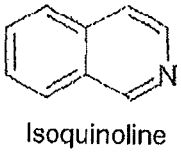 Isoquinoline | 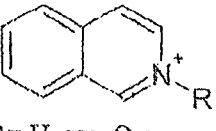<br>R= H, gga, O-gga |
| 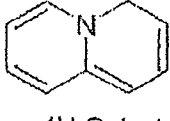 4H-Quinolazine | |
| 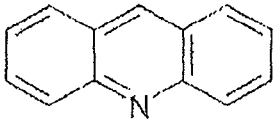 Acridine | 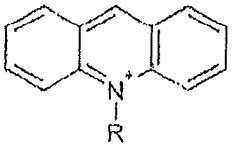<br>R= H, gga, O-gga |
| 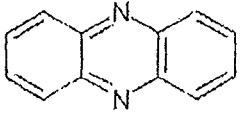 Phenazine | 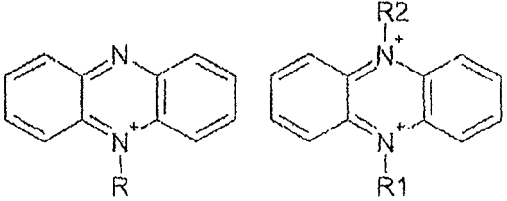<br>R= H, gga, O-gga<br>R1= H, gga, O-gga<br>R2= H, gga, O-gga |
FIG. 19

Table 2. (continuation)

| Structure | Substituents |
|---|---|
| 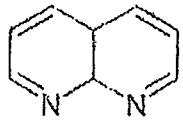 1,8 naphthyridine | 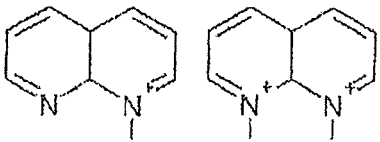<br>R = H, gga, O-gga<br>R1 = H, gga, O-gga<br>R2 = H, gga, O-gga |
| 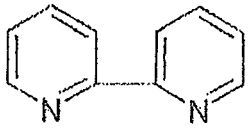 2,2' Bipyridine | 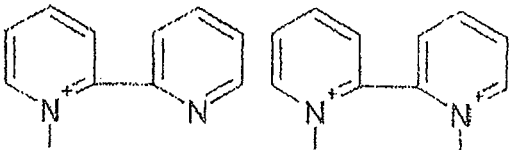<br>R = H, gga, O-gga<br>R1 = H, gga, O-gga<br>R2 = H, gga, O-gga |
|  4,4' Bipyridine | <br>R = H, gga, O-gga<br>R1 = H, gga, O-gga<br>R2 = H, gga, O-gga |
| 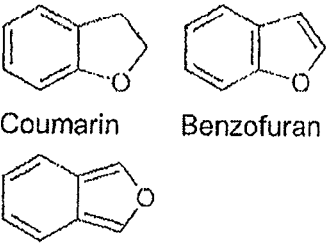 Coumarin   Benzofuran<br>Isobenzofuran | All alkyl, acrylic, allyl, acyl and amide derivatives in all positions |
| 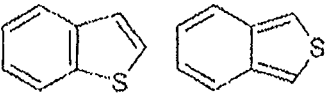<br>(b) benzothiophene, (c) benzothiophene | All alkyl, acrylic, allyl, acyl and amide derivatives in all positions |
| 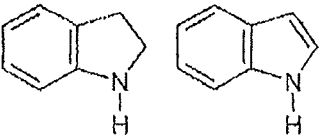<br>Indolin,   Indole | All alkyl, acrylic, allyl, acyl and amide derivatives in all positions |

*FIG. 20*

Table 2. (continuation)

| Structures | Derivatives |
|---|---|
| 3H-Indole, 1H-Isoindole, Benzimidazole, 1H-Indazole, Cyclopentapyridine | |
| Indoazine, benzoazalone, 2,1benzoisoazalone, benzothiazole | All alkyl, acrylic, allyl, acyl and amide derivatives in all positions |
| carbazole | carbazole with R substituent; R = H, gga, |
| Tetrathiafulvalene (TTF) | BEDT-TTF, C1TET-TTF, BCP-TTF, TMTTF, TMTSF, DMET, EDTDM, EDO-TTFX, TTM-TTP, DBTS, BPM-TTP, BMA-TTP. bis(ethylenedithio)tetrathiafulvalene (BEDT-TTF) 4,5-bis(methylthiol)-4,5-ethylenedithio tetrathiafulvalene (C1TET-TTF), benzocyclopentathene tetrathiafulvalene (BCP-TTF), tetramethyltetratetrathiafulvalene (TNTTF) tetramethyltetraselenafulvalene (TMTSF) 4,5-dimethyl -4 5- |

FIG. 21

Table 2 (continuation)

| | |
|---|---|
| | ethylenedithio-1 3 dithia-1,3-diselenafulvalene (DMET), 4 5-dimethyl ethylenedithio tetrafulvalene (EDTDM) 4,5-dibromo (or diiodine) -4,5-ethylenedioxytetrafulvalene (EDO-TTFX2 (X: Br I) 2 5 bis(4,5-bis(methylthio)-1,3-dithiol-2-ylidiene)-1,3,4 6-tetrathiapentalene (TTM-TTP), bis(ethylenedithio) tetraselenafulvalene (BETS) 2 5-bis(1,3-dithiolan-2-ylidiene)-1 3,4,6-tetrathiapentalene (BDH-TTP), 2,5-bis(1,3-dithian-2-ylidiene)-1 3 4 6- tetrathiapentalene (BDA-TTP) |
| 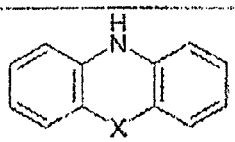<br>X=S<br>X=Se<br>Phenothiazine, Phenoselenazine | 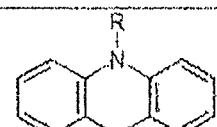<br>X=S, Se<br>R=H, gga |
| 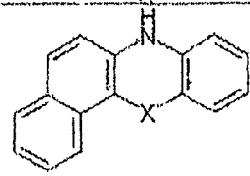<br>X=S<br>X=Se<br>Phenyl-Phenothiazine, Phenyl-Phenoselenazione | 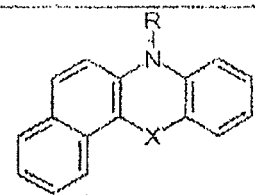<br>X=S, Se<br>R=H, gga |
| 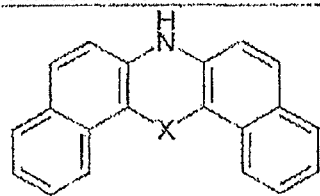<br>X=S<br>X=Se<br>Diphenyl-phenothiazine, Diphenyl-phenoselenazine | 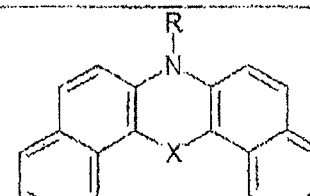<br>X=S, Se<br>R=H, gga |

FIG. 22

CIRCUIT ARCHITECTURE ON AN ORGANIC BASE AND RELATED MANUFACTURING METHOD

BACKGROUND

1. Technical Field

The present invention in its most general aspect refers to the sector of electronics, and more in particular to a circuit architecture of organic nature, also called an organic base, and a related manufacturing method.

2. Description of the Related Art

As is known, circuit architecture in electronic devices are generally obtained through photolithographic methods.

In particular, photolithographic technique or photolithography is a process of a photographic nature which is employed to trace microgeometries on a silicon wafer, and in microelectronics it is used to transfer the design of a photomask on such wafer.

Photolithography essentially comprises three main operations which, even if known, are briefly described below so to better elucidate the present invention.

A first operation consists of drawing the geometric configuration (design), to be transferred later on a microscopic scale, on a sheet in a much greater scale than the final microscopic scale, so that the start design can be carried out with conventional methods and specifications.

The design is then photographed and reduced to the microscopic scale of actual interest, on a glass sheet or other materials, the so-called photomask.

The second operation consists of transferring the design of the photomask on the surface layer of the silicon wafer (substrate), on which a photo-sensitive emulsion layer is first applied, generally a polymer, called a photoresist.

In such operation, the transfer of the design is obtained by projecting the design of the photomask with an ultraviolet light beam onto the photoresist layer and then developing with a chemical etching, according to the normal photographic method.

Then, either the portions of the photoresist unaffected by light, which are therefore soluble in the developer bath (negative lithography), are removed or the photoresist portions are exposed and hence rendered soluble in the developer bath (positive lithography) are removed.

Therefore, the design geometry will be reproduced on the wafer which was initially drawn on the photomask due to the photo-incision made on the photoresist through the ultraviolet radiation.

The third operation consists of subjecting the substrate thus treated to a chemical-physical process such as, for example, diffusion of doping material, vacuum deposition of new material, or ion implantation, through which, at portions no longer covered by the photoresist, the substrate is modified so to create predetermined desired characteristics for the electronic conduction.

Then, the residue portions of the photoresist are also chemically removed.

The aforesaid operations are repeated as many times on the same wafer, with different photomasks employed, as needed to realize complex structures which then give rise to electronic devices.

Regarding the aforesaid photoresist, it should be noted that they are generally polymers with molecular weights normally in the range of 100,000-200,000 dalton whose properties, including viscosity, softening temperature, and degradation temperature, are optimized according to the specific case by acting in fact on the molecular weight.

A conventional photoresist mixture is typically composed of: a resin base, or binder which ensures mechanical properties of the mixture (adhesion, chemical strength etc.); a solvent which controls a number of the mechanical properties (for example the viscosity of the mixture); and a photo-active material (photo-active compound (PAC)), which specifically is the photoresist which in turn can be of negative or positive type, as will be clearer below.

A negative photoresist is used in negative photolithography processes, in which after exposure to UV radiation, a chemical etching treatment (chemical attack) eliminates the photoresist portion not exposed to the light.

In this case, the photoresist mixture, containing the precursor monomers or oligomers for exposure to the incident UV radiation, undergoes a photo-polymerization and/or photo-cross-linking reaction.

The cross-linking of the photoresist determines an increase of its molecular weight, which induces a diminution of the solubility of the photoresist in some solvents.

Examples of negative photoresists are reported below, and comprise:

Mixtures of alkenes and azides or bisazides.

The azides are photo-decomposed by UV action into highly reactive species of a radical nature, such as nitrenes.

The latter, reacting with the unsaturated reactive sites of the alkenes, lead to the formation of the respective polymers, through three different possible types of non-selective reaction, corresponding to double bond cycloaddition, insertion reaction of C—H bonds, and elimination reaction of hydrogen atoms.

Poly(p-hydrostyrene) with monofunctional bisazides or azides represent a typical photoresist mixture.

Polyamides.

In this case, the acid groups of the precursor of the polyimide, poly(amic-acid) are functionalized with methacrylated groups and deposited in the presence of appropriate non-radical photo-active initiators.

The exposed photoresist portions then undergo cross-linking reactions, while, through the treatment with an appropriate solvent, the non-exposed portions are removed.

The resulting image is then subjected to a heat treatment (annealing), so to degrade the methacrylated units.

By means of cyclization of the poly(amic acid), the most stable polyamide is formed.

Polymers which have side-chain maleimide groups capable of giving photodimerization reactions.

Copolymers of tetrathiafulvalene (TTF) and poly(chloromethylstyrene) (PSTFF).

In the presence of electron-acceptor species (for example halides) and after exposure to radiation X, the comonomers polymerize by charge transfer reactions.

A positive photoresist is instead used in a positive lithography process in which, after exposure to UV radiation (deep UV, extreme UV or electron beam radiation [e-beam photolithography]), an etching treatment eliminates the photoresist portion exposed to the light.

In this case, the mixture of the photoresist containing the polymer undergoes a photo-degradation reaction due to the exposure to the incident UV light.

In such degradation reaction, several of the covalent bonds of the polymer chain are broken and the molecular weight of the polymer decreases.

The monomer or oligomer fragments, being more volatile and/or soluble in the etching solvents, are subsequently eliminated.

Known examples of positive photoresists are reported below, and comprise:

Acrylated, methacrylated polymers, their respective fluorinated and oximine derivatives, and their copolymers, including polymethylmethacrylate (PMMA).

A widely used polymer in e-beam photolithography, since it is provided with excellent properties of adaptation to the underlying layer (coating) and of development, is the poly (2,2,2-trifluoroethylmethacrylate).

DQN, where DQ represents the photo-active diazoquinone and N represents the compound known with the name of Novolac, a phenol resin.

After exposure to UV radiation, the photo-active bond C—$N_2$ of DQ, which renders the polymer insoluble in the deposition mixture, is broken, with the liberation of $N_2$ and formation of a carboxylic group which makes the photoresist soluble.

Polybutenesulfone (PBS) and alkene-sulfone copolymers such as, for example, PBS with 5-hexen-2-one, which has shown optimal coating, adhesion and image properties in this polymer class.

After exposure to UV radiation, the polymer skeleton is broken and the fragments obtained convert into sulphur dioxide ($SO_2$) and alkenes.

Positive photoresists can also be composed of mixtures which, after exposure to UV radiation, undergo photo-catalyzed degradation reactions.

In these cases, a sensitizer is added to the mixture, i.e., an additive containing photo-labile groups, often photo-induced acid-generators, which catalyze the degradation of the polymer and the consequent diminution of its molecular weight.

An example of this type of photoresist are mixtures of poly(acetaldehyde) or poly(formaldehyde) with poly(vinyl chloride) and small quantities of electron-attractors.

From that set forth above, it is clear that in the conventional photolithography processes as described, a photoresist constitutes a sacrificial material, in the sense that, in such processes, a photoresist layer is deposited so as to be removed later, its use being directed towards the transfer of a geometric configuration (design) from a photomask to a layer of a different material, on which it is deposited.

In particular, it should be noted that, in a circuit structure obtained by means of photolithography as described above, the photoresist employed is entirely removed during the process and therefore the final circuit structure will not comprise any photoresist layer.

The photoresist is in fact entirely removed through two distinct steps, a first etching step being carried out after exposure to UV radiation in order to transfer the desired design onto the wafer, a second etching step carried out after the wafer has been subjected to one of the aforesaid processes of chemical-physical nature, in order to confer predetermined electronic conduction characteristics to the substrate portions not covered by the photoresist.

Therefore, even if in keeping with the object, it should be noted that, overall, the known processes for manufacturing circuit architectures through the use of photolithography and photoresists as described above are not free of drawbacks, including the main drawback of having to carry out a high number of steps as a consequence of the use of photoresist layers as sacrificial material.

It should moreover be considered that, in the sector of hybrid electronics, that is, in case of circuit structures or architectures on an organic base, further steps of manufacturing and/or integration of the organic components in the particular circuit architecture are to be carried out.

BRIEF SUMMARY

One embodiment is a method for manufacturing architectural circuits, and, in particular, organic-based architectural circuits which includes a lower number of steps with respect to the known methods and processes and which is economically convenient.

One embodiment is an organic-based circuit architecture which comprises, as structural element and active component, at least a layer or portion of photo-sensitive active material, of photo-sensitive polymers (photoresist polymers). Another embodiment is a related manufacturing method employing photolithography, in which photoresist polymers do not constitute sacrificial material in the sense considered above.

With "active component" it is here intended a layer of active material of the aforesaid type, i.e., photo-sensitive and of polymer nature in the sense that the material undergoes polymerization or degradation reaction when exposed to ultraviolet radiation of a predetermined wavelength, which is moreover active in the sense that it is capable of giving appropriate electric responses of bistable type (electro-bistable material), and/or capable of making systems or organic complexes with charge transfer or which acts as an organic semiconductor of type p or n, in particular after having been deposited, having been subjected to UV irradiation and etching treatment according to photolithographic techniques.

In practice, the method includes:

providing a layer of a predetermined material constituting a bottom electrode;

depositing on said bottom electrode a film of an active material comprising at least a first structural portion having an absorption peak at a predetermined UV wavelength in which such first structure portion is photo-activatable at said predetermined wavelength and which is constituted by monomers or oligomers which, when irradiated at said predetermined wavelength, undergo a photo-polymerization and/or photo-cross-linking reaction, or that, alternatively, it is constituted by a polymer that at said predetermined wavelength undergoes a photodegradation reaction, and at least a second electrically active or activatable structural portion, substantially transparent to said predetermined UV wavelength;

exposing at least a portion of said active material film, through a photomask with predetermined geometry, to UV radiation having said wavelength UV, with photo-activation of said exposed portion of said film;

treating said active material film with a predetermined agent, selectively removing one of the two positions of said film, respectively exposed/photo-activated and not exposed, with the exposure of a respective portion of said bottom electrode;

depositing a second layer of a predetermined material, obtaining a top electrode.

An architecture thus obtained constitutes a so-called elementary memory cell.

In the case of more complex circuit architectures, such as the crossbar architectures or those comprising a plurality of such memory cells, such as for example the multilayer architectures, the present method provides the insulation of the single memory cells through the interposition of a dielectric material between them.

In this case, such dielectric material is deposited "upstream" of the top electrode, on which there is in turn deposited, in the case of multilayer architecture, a further film of active material with repetition of the steps described above.

In particular, in order to make the aforesaid insulation, the method provides to make the aforesaid bottom electrode on a substrate and the further step of:

depositing a dielectric material on the non-removed portion of said active material and on the exposed substrate portion;

treating said dielectric material with a predetermined agent with its partial removal and selective exposure of said non-removed active material film portion;

then the top electrode is manufactured.

Therefore, the circuit architecture thus obtained in its different configurations comprises, a structural element and active component, a portion of the aforesaid active material film, whose active material, in accordance with the invention and as mentioned above, should be intended both as the material used in the present method according to the aforesaid step in which the active material film (i.e., non photo-activated) is deposited, and as the material obtained following the aforesaid step in which it is partially exposed through a photomask to the UV radiation of predetermined wavelength (photo-activated material or active component).

The active materials which can be used comprise polymers (including the respective monomers and oligomers), mixtures of polymers, copolymers and their mixtures which are intrinsically active or which act as matrix for active molecules dispersed therein—i.e., composite materials having polymer matrices including nanocomposites; polymers functionalized by means of chemical bonds or non-bond interactions with active molecules, mixtures of conventional photoresists in which active molecules are dispersed, where by mixtures of conventional photoresists it is here intended mixtures of commercial, already existing photoresists containing at least a polymer, both in polymer and monomer or oligomer form, and possibly a binder, a resin, a solvent, an initiator and the like.

Certain embodiments use as active material, a polymer or a photo-sensitive (photo-active) polymer mixture which is intrinsically electro-bistable.

Certain embodiments use as active material a dispersion of electro-bistable molecules (second structural portion) in a chemically inert photo-active polymer matrix (first structural portion).

Certain embodiments use as active material a dispersion of molecules apt to make charge transfer systems or complexes (second structural portion) in a chemically inert photo-active polymer matrix (first structural portion).

Some embodiments use as active material a dispersion of active molecules (second structural portion) which form, with a chemically inert photo-active polymer matrix (first structural portion) a charge transfer complex.

Some embodiments use as active material a photo-active polymer (first structural portion) having electro-bistable molecular or functional groups (second structural portion), pendant from and chemically bonded to its main chain.

Some embodiments use as active material a photo-active polymer or copolymer (first structural portion) having at least two different molecular or functional groups (second structural portion) chemically bonded as pendant groups from the main chain of the photo-active polymer, and apt to make charge transfer reactions, said at least two groups having one indifferently an electron-acceptor character, and the other an electron-donor character.

Some embodiments use as active material a photo-active polymer (first structural portion), having molecules (second structural portion) chemically bonded thereto as pendant molecular groups, said molecules apt to make with the polymer—i.e., with the main polymer chain—charge transfer reactions.

Some embodiments use as active material a photo-active polymer (first structural portion) having electro-bistable molecular or functional groups (second structural portion) inserted and distributed along the main chain of the polymer which confer an electro-bistable character to the entire structure when a voltage is applied.

In practice, by the use of photolithographic techniques on an active polymer material like that considered, there is a considerable simplification of the entire manufacturing process of "non-conventional" memories, like the organic memory devices, and more in general in the manufacture of organic-based circuit architectures in electronic devices, of type TFT, with even complex geometries.

Further characteristics and advantages will be clearer from the detailed description, accompanied by several embodiments of circuit architectures in organic-based electronic devices and of use of an active material as described above as structural element and active component of the circuit architectures, made here below with reference to the attached drawings, provided as illustrating and non-limiting purposes.

BRIEF DESCRIPTION OF THE SEVERAL VIEWS OF THE DRAWINGS

In such drawings:

FIGS. 1A-1D schematically show several steps of a method for obtaining a circuit architecture in an electronic device on an organic base;

FIGS. 2A-2G schematically show several steps of the method of FIGS. 1A-1D according to a variant embodiment to make a circuit architecture in an organic-based electronic device of crossbar type;

FIGS. 3A-3G schematically show several steps of the method of FIGS. 1A-1D according to a further variant embodiment to make a circuit architecture in an organic-based electronic device of multilayer type;

FIGS. 10A-10C show a synthesis diagram for obtaining a further variant embodiment of an active material;

FIGS. 12 and 13 report, in Table 1, examples of molecules and related derivatives having electron-acceptor character, usable in accordance with some embodiments.

FIGS. 14-22 report, in Table 2, examples of molecules and related derivatives having electron-donor character.

DETAILED DESCRIPTION

Figure 4:
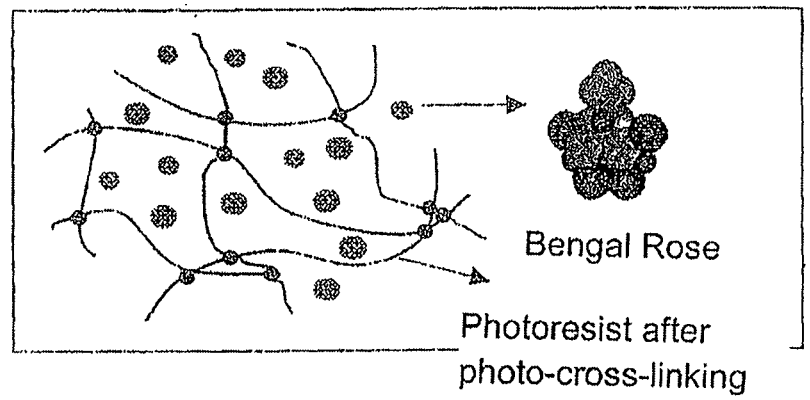
FIG. 4 shows a diagram of an active material used according to one embodiment.

The steps described below do not form a complete flow of a method for obtaining an organic memory cell and more in general a circuit architecture in an organic-based electronic device, and here below only those steps are described which are useful for an average skilled person to understand the method and circuit architecture.

It should be noted, moreover, that the figures represent schematic views, not drawn in scale, of portions of the aforesaid architecture during several steps of the method.

One embodiment can be put into practice using the normal techniques used in the manufacture of electronic devices, in particular the lithography of conventional type which has been previously discussed and to which reference is made.

With reference to FIG. 1D, a circuit architecture of the type of an organic-based memory cell obtained with the present method is indicated in its entirety with 1.

The circuit architecture 1, so-called sandwich architecture, comprises a so-called bottom electrode 2 composed of a layer of a first material, for example glass-ITO, a metal, a conductive polymer and similar materials, a plurality of top electrodes 3 composed of discontinuous portions of a layer of a second material such as for example silicon, glass, a conductive polymer and similar materials and a plurality of active material portions 4 composed of discontinuous portions of an active material layer interposed between and in contact with the bottom electrode 2 and the top electrodes 3.

The aforesaid circuit architecture 1 is obtained in accordance with the present method, through the following described steps.

First, the bottom electrode 2 is provided in a per se known manner; on this bottom electrode 2 a film of photo-sensitive active material 4a is deposited, for example by means of spin-coating or spin-casting technique or through other conventional techniques, as indicated in FIG. 1A.

The photo-sensitive active material of such film 4a comprises at least a first structural portion having an absorption peak at a predetermined UV wavelength, which is photo-sensitive to said predetermined wavelength and which is composed of monomers or oligomers which, when irradiated at such predetermined wavelength, undergo photo-polymerization and/or photo-cross-linking reactions, or of a polymer which, at such predetermined wavelength, undergoes a photo-degradation reaction, and at least a second electrically active or activatable structural portion which is substantially transparent to such predetermined UV wavelength.

Then, the photo-sensitive active material film 4a, through a photomask 5 appropriately chosen according to the geometry which one wishes to make, is incised by means of UV radiation, as shown in FIG. 1B.

In practice, through the photomask 5, at least a portion of the photo-sensitive active material film 4a is exposed, with the photo-activation of such exposed portion and consequent photo-polymerization or photo-degradation of the exposed photo-sensitive active material, depending on its nature.

Also the wavelength and the power of the irradiation are chosen and optimized according to the particular active material used.

Subsequently, the film of photo-activated active material 4a is treated with a predetermined agent, which selectively removes one of the following portions, either that exposed to the radiation and photo-activated (positive photolithography) or that not exposed to the radiation (negative photolithography), with consequent exposure of a respective portion of the bottom electrode 2.

In particular, in the example of FIG. 1C, the portions have been removed which were exposed to the radiation and photo-activated, through a treatment which is defined etching and which is executed with appropriate solvents.

The remaining discontinuous portions, i.e., those not removed, of the film of photo-sensitive active material 4a subjected to the etching treatment are those previously indicated with 4.

Then, the organic-based circuit architecture in memory cell form is completed by means of deposition of the top electrodes 3, carried out for example by means of metal evaporation technique, using an appropriate mask with the obtainment of the architecture 1.

In case of more complex circuit architectures, such as for example the so-called crossbars, in which memory cells are integrated in an electronic device, the present method provides the insulation of the memory elements of different cells, which is obtained by depositing between them, "upstream" of the top electrode, an insulating material such as an insulating polymer.

In such case, with reference to FIGS. 2A-2G, a plurality of bottom electrodes 30 parallel to each other (array), is made (deposited) on a substrate S, for example silicon or glass.

The bottom electrodes 30 are deposited, with the aid of a first photomask having substantially rectangular windows (design) which reproduce the outline of the electrodes, by means of techniques such as thermal evaporation, sputter, microtransfer molding, microcontact printing or other techniques known for such purpose—FIG. 2A.

Then, analogous to that described above, the film of photo-sensitive active material is first deposited, always indicated with 4a—FIG. 2B, then such film of photo-sensitive active material is incised by means of UV radiation—FIG. 2C and finally it is subjected to etching treatment to eliminate the sacrificial active material film portion, exposed or not exposed, in a positive or negative process, respectively—FIG. 2D.

Such operations schematized in FIGS. 2B-2D determine the formation of the discontinuous active material portions indicated with 4 and positioned above the bottom electrodes 30. The active material film was incised by using a second mask having substantially square windows so as to leave exposed predetermined portions of the bottom electrodes 30, as can be noted with reference to the top view of FIG. 2D.

Subsequently, a dielectric material film 6 is deposited on the non-removed active material portions 4, on the exposed portions of the bottom electrodes 30, and on the exposed substrate portion S, i.e., non-covered by the bottom electrodes 30—FIG. 2E.

A dielectric material, may be deposited, for example, polyethyleneterephthalate (PET) in m-cresol, polycarbonate, polyethylnaphthalate, polystyrene and similar materials with dielectric properties through casting or spin-casting techniques.

Then, to liberate the active memory elements, i.e., the discontinuous active material portions 4, that is that remaining and not removed of the previously deposited film 4a, a controlled etching treatment is carried out by means of a predetermined agent, for example a known treatment such as RIE CF4 (fluorite-based reactive ion etching) which permits the controlled (partial) removal of the dielectric material film up to the liberation, i.e., until the exposure, of the aforesaid discontinuous active material portions 4, as illustrated in FIG. 2F in which also the top view is shown.

Finally, similarly to that previously described, the top electrodes are deposited on top of the exposed, discontinuous active material portions 4 and the remaining dielectric material film indicated with 6a; here also the top electrodes are indicated with 3.

As indicated in the FIG. 2G, such top electrodes 3 are directed orthogonally to the bottom electrodes 30 and are obtained through the aforesaid first mask rotated by 90 degrees.

In such a manner, a circuit architecture 10 is obtained on an organic base of so-called crossbar type, shown in FIG. 2G also in top view.

For even more complex architectures, the present method provides the repetition of several of the aforesaid process steps which can be repeated n (n≧1) times to make so-called multilayer crossbar architectures.

In such case, as illustrated in FIG. 3, one starts from the previously described crossbar architecture 10 (FIG. 3A), on which the above-described steps are repeated, in particular starting from the top electrodes 3. These steps include depositing an active material film 4a—FIG. 3B, exposing at least a portion of the active material film to UV radiation—FIG. 3C, treating the active material film with a predetermined agent with its partial and selective removal and obtaining the discontinuous active material portions 4—FIG. 3D, and also depositing a dielectric material film 6 on the active material portions 4 and on the exposed portions of the bottom electrodes—FIG. 3E, which is then treated with a predetermined agent (controlled etching) with its partial removal, leading to the selective exposure of the discontinuous non-removed active material portions 4—FIG. 3F.

Then, still analogous to that described above, the deposition is carried out on further top electrodes 40 by using the aforesaid first mask, re-rotated by 90 degrees, i.e., with the same orientation with which the bottom electrodes 30 were obtained.

Such steps are schematized in FIGS. 3A-G, in which in the respective passage g), a multilayer (bilayer) architecture 100 is shown also comprising the insulation, by means of the dielectric material, of the further top electrodes 40.

Generalizing the bilayer structure described above, there is provided a multilayer structure which comprises at least two discontinuous films of active material, in which consecutive discontinuous active material portions are separated by, and each have a face in contact with, top electrodes of order m—in FIG. 3G corresponding to the top electrodes 3, the remaining related faces respectively being in contact with electrodes of order m−1—in FIG. 3G corresponding to the bottom electrodes 30, and the other with electrodes of order m+1—in FIG. 3G corresponding to the further top electrodes 40, in which between electrodes of consecutive order a layer of dielectric material is comprised.

Regarding the aforesaid photo-sensitive active material, several examples are reported below related to its structure, its constitution, and its obtainment.

It is first of all useful to remember, as previously described, that such photo-sensitive material is advantageously composed of photo-sensitive polymer material (respective monomers and oligomers included) which comprises polymers, mixtures of polymers, copolymers and their mixtures which are intrinsically active or which act as matrix for active molecules dispersed therein—i.e., composite materials with polymer matrix including the nanocomposites; polymers functionalized by means of chemical bonds or non-bond interactions with active molecules, mixtures of conventional photoresists in which active molecules are dispersed, where, by mixtures of conventional photoresists, are here intended mixtures of already existing commercial photoresists containing at least a polymer, both in polymer form and monomer or oligomer form, and possibly a binder, a resin, a solvent, an initiator and the like.

According to a first example, such active material is composed of intrinsically electro-bistable photo-active polymers.

In such case, commercial or chemically synthesized photo-active polymers can be used which are intrinsically electro-bistable.

An example of such polymers are the PMMA derivatives, including commercial polymethylmethacrylate-co-9-anthracenylmethylmethacrylate.

According to a further example, the photo-sensitive active material is composed of an electro-bistable molecule dispersion in a photo-active polymer matrix.

In particular, the photo-active polymer acts as an inert structural matrix in which the electro-bistable molecules (active molecules) are dispersed.

Examples of bistable molecules which can be used are fluorescein and its derivatives, DDQ (2,3-dichloro-5,6 dicyano-p-benzoquinone), DDME (1,1-dicyano-2,2-(4-dimethyl aminophenyl) ethylene), Ni-Pc (nickel (II) phthalocyanine tetrasulfonic acid tetrasodium), AIDCN (2-amino-4,5 imidazole dicarbonitrile), DMNDPA (N, N-dimethyl-N-(3-nitrobenzylidene)-p-phenylenediamine).

Examples of polymers which can be used are:
for positive lithography processes, PMMA and respective fluorinated and oximine derivatives;
for negative lithography processes, photo-cross-linkable polymers or oligomers can be: systems which contain side-chain maleimide groups capable of giving photodimerization reactions, systems containing side-chain azidoaryl groups which utilize the coupling reaction between nitrene groups in turn formed by irradiation of the azide derivatives; systems on acrylic and methacrylic or vinyl ether base containing variously substituted side-chain chalcone groups which utilize the photocyclization reaction of the double bonds of such groupings.

Alternatively, also commercial photoresists can be used.

FIG. 4 shows a diagram of a such active material in which electro-bistable molecules are dispersed in a polymer matrix of the photoresist.

According to a further example, the photo-sensitive active material is composed of a dispersion of molecules capable of giving rise to a charge transfer system in a photo-active polymer matrix.

In practice, a photo-active polymer is used which acts as a chemically inert structural matrix in which are dispersed at least two different molecular species capable of generating charge transfer systems or complexes, such two different molecular species having one indifferently an electron-donor character, and the other an electron-acceptor character.

Figure 13:
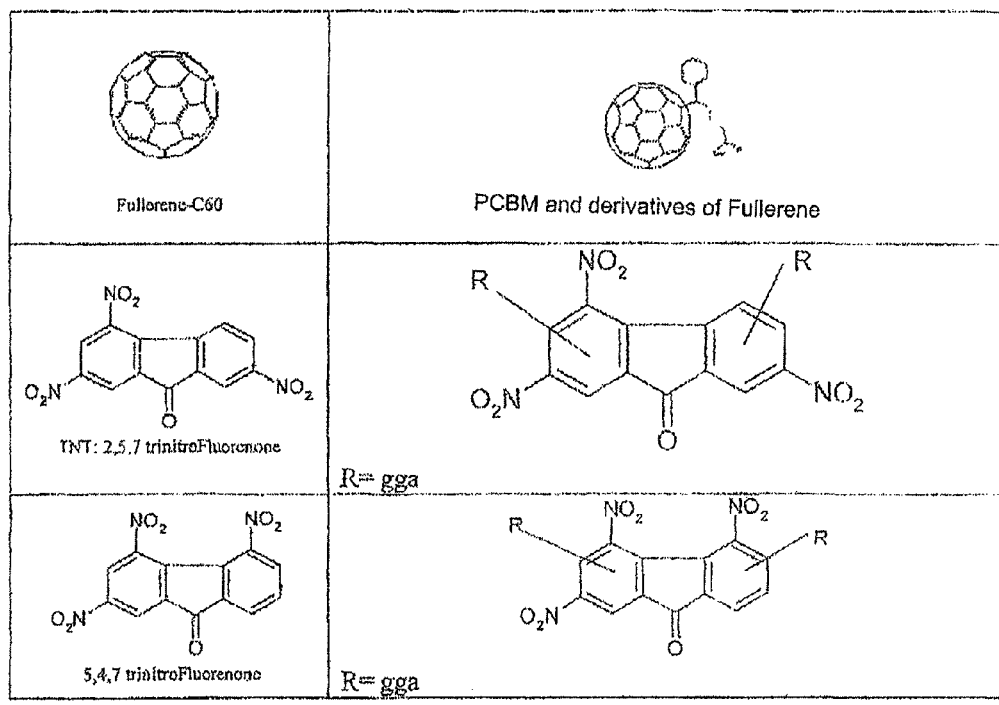

Examples of molecular species having the aforesaid properties are reported in the Table 1 shown in FIGS. 12 and 13 (electron-acceptor species and related derivatives) and in Table 2 shown in FIGS. 14-22 (electron-donor species and related derivatives).

An appropriate combination between two or more species indicated in the aforesaid table therefore generates a charge transfer molecule system.

Examples of such combination are: tetracene/DDQ (2,3-dichloro-5,6 dicyano-p-benzoquinone), perylene/Cl4Q (p-chloranil), tetracene/InCl3 (Indium Trichloride), Cu/TCNQ, MC/TCNQ, Fullerene-C60/Metal-Phthalocyanine, Fullerene-C60/TTF.

Examples of polymers which can be used are:
for positive lithography processes, PMMA and its fluorinated or oximine derivatives;
for negative lithography processes, photo-cross-linkable polymers or oligomers can be: systems which contain side-chain maleimide groups capable of giving photodimerization reactions; systems containing side-chain azidoaryl groups which utilize the coupling reaction between nitrene groups, in turn formed by irradiation of the azide derivatives; systems on an acrylic and methacrylic or vinyl ether base containing variously substituted side-chain chalcone groups which utilize the photocyclization reaction of the double bonds of such groupings.

Alternatively, also commercial photoresists can be used.

According to a further example, the photo-sensitive active material is constituted by a dispersion of active molecules which form, with a polymer matrix, a charge transfer complex.

In practice it is used a photoresist polymer which acts as structural matrix in which molecules are dispersed wherein the polymer and the molecules are chosen in a manner such that the obtained mixture, i.e., the resulting composite material, gives rise to charge transfer processes.

In such case, either the polymer or the active molecular species has one indifferently an electron-acceptor character, and the other of the two has an electron-donor character, so that appropriate combinations of electron-donor photo-active polymers (some existing on the market) with one or more molecules with electron-acceptor character (for example selected from the above Table 1) or combinations of electron-acceptor photo-active polymers with one or more molecules with electron-donor character (for example selected from the above Table 2) give rise to charge transfer molecular systems.

Examples of a charge transfer system of this type comprise: Fullerene-C60 dispersed in a copolymer of tetrathiafulvalene (TTF) and poly(chloromethylstyrene (PSTFF), polymethyl-methacrylate-co-9-anthracenylmethylmethacrylate (commercial) in which one or more molecules selected from Table 1 are dispersed.

Figure 5:
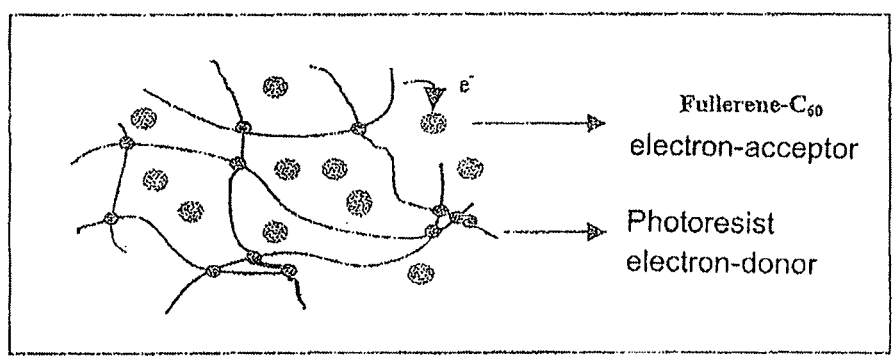
FIG. 5 shows a diagram of a variant embodiment of an active material.

FIG. 5 shows a diagram of an active material realized according to the present example, in which the photo-active polymer matrix has electron-donor character and in which molecules of electron-acceptor Fullerene-C60 are dispersed. It is possible to note, inside the composite material thus realized, micro-interface zones between the electron-donor and electron-acceptor elements which are apt, following the application of an appropriate voltage, to give rise to charge transfer reactions.

Alternatively, also commercial photoresists can be used.

According to a further example, the photo-sensitive active material is composed of photo-active polymers with pendant electro-bistable molecules.

In practice, in this case use is provided of a photo-active polymer which carries electro-bistable, pendant molecular or functional groups.

Such active material can be obtained:

by means of chemical synthesis, thus by polymerization of comonomers functionalized with electro-bistable molecular or functional groups;

by grafting of the electro-bistable molecular groups following the synthesis of the polymer chain.

Figure 6:
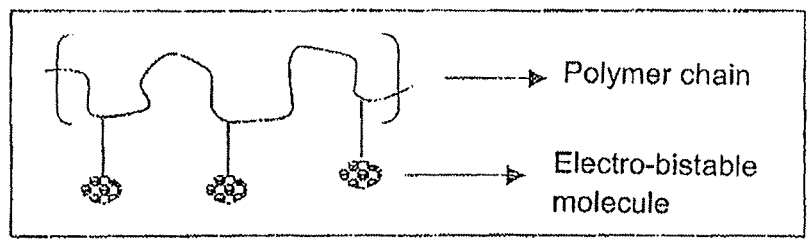
FIG. 6 shows a diagram of a further variant embodiment of an active material.

FIG. 6 shows a diagram of an active material according to the present example in which a photoresist polymer is functionalized with electro-bistable, pendant molecular or functional groups.

Examples of polymers functionalized with electro-bistable molecules comprise: acrylated polymers and/or methacry-lated polymers functionalized with fluorescein and its derivatives, for example Bengal Rose.

On the market there exist many polymers and copolymers functionalized with chromophoric, fluorescent and/or electro-bistable groups which can be used, such as for example: poly(fluorescein-O-acrylate) and poly[methylmethacrylate-co-(fluorescein O-acrylate)], poly[methylmethacrylate-co-(fluorescein O-methacrylate)], which can be purchased at Sigma-Aldrich.

Figure 7:
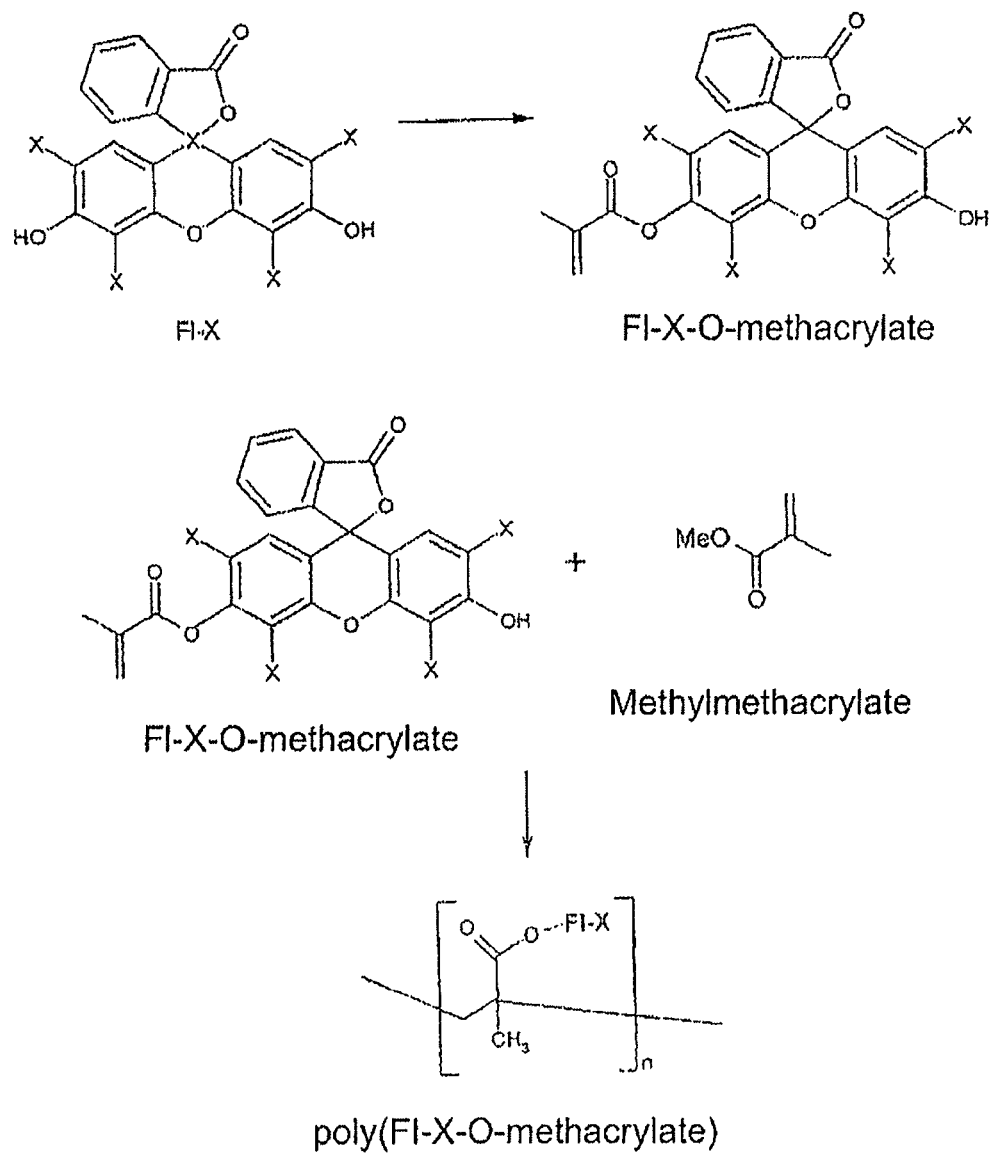
FIG. 7 shows a synthesis example for obtaining the variant embodiment of the active material of FIG. 6.

Alternatively, the functionalized polymer can be obtained by means of chemical synthesis, whose strategy is schematized in FIG. 7 and can be summarized as follows:

the electro-bistable molecule (for example a derivative of the electro-bistable fluorescein, Fl-X) is functionalized with a reactive functional group, for example the methylmethacrylic group. The fluorescein thus modified is made to react with a solution containing the precursor monomer (for example methylmethacrylate); in such a manner, the polymer is obtained with the electro-bistable molecule covalently bonded and pendant.

According to a further example, the photo-sensitive active material is composed of photo-active polymers with pendant electron-acceptor and electron-donor molecules apt to give rise to charge transfer reactions.

In practice, a photo-sensitive copolymer is used which carries pendant functional groups capable of giving rise to charge transfer reactions, that is in which the different polymer units of the copolymer contain functional groups with respective electron-acceptor (A) and electron-donor (D) character.

Figure 8:
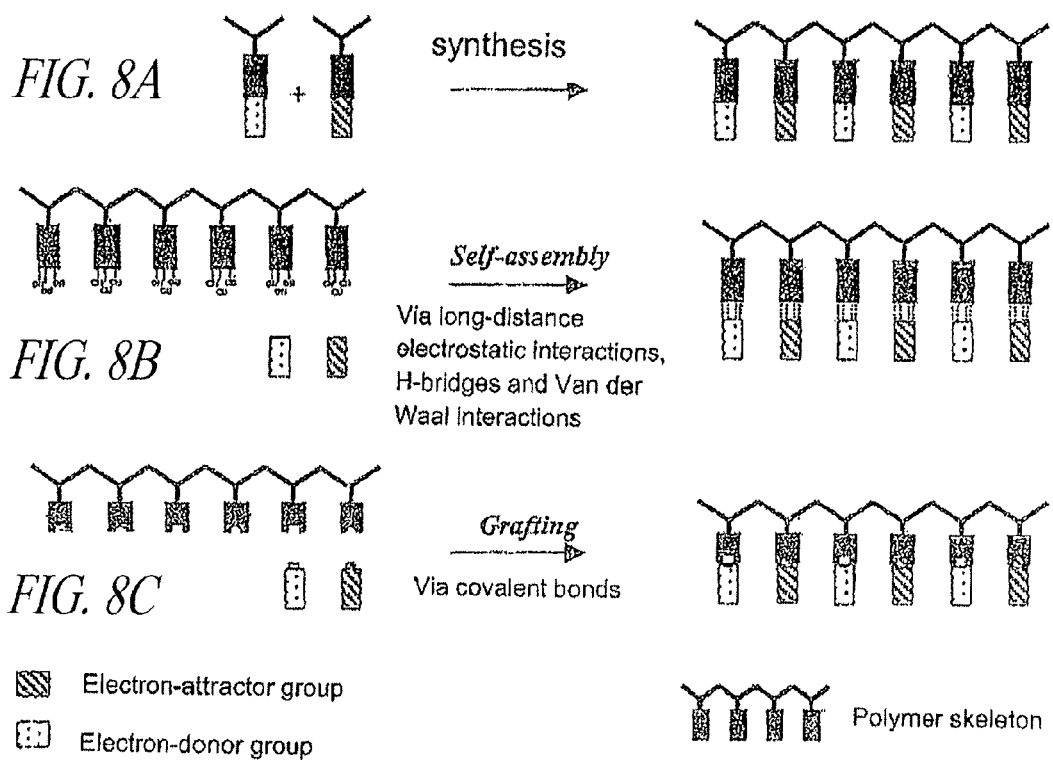
FIGS. 8A-8C show a synthesis diagram for obtaining a further variant embodiment of an active material.

This can be obtained as reported below, and as is also illustrated in FIGS. 8A-C in which the synthesis is schematized for obtaining the active material according to the present example, in which a photoresist polymer contains electron-donor groups and electron-acceptor groups covalently bonded to the polymer skeleton:

by means of chemical synthesis, thus by polymerization of comonomers functionalized with electron-attractor and electron-donor groups—FIG. 8A. The copolymers which are obtained can be alternated (ADADADAD), irregular (DAAADDAD) or in blocks (AAAADDDD);

by self-assembly between the polymer skeleton and groups themselves—FIG. 8B;

by grafting following the synthesis of the polymer skeleton—FIG. 8C.

The pendant groups bonded to the polymer chain must be chosen in a manner such that after applied voltage they give rise to reactions and intra-chain charge transfer.

An example of functionalized polymer DA is the copolymer PMMA functionalized with PCBM (A) and with carbazole (D).

Figure 9:
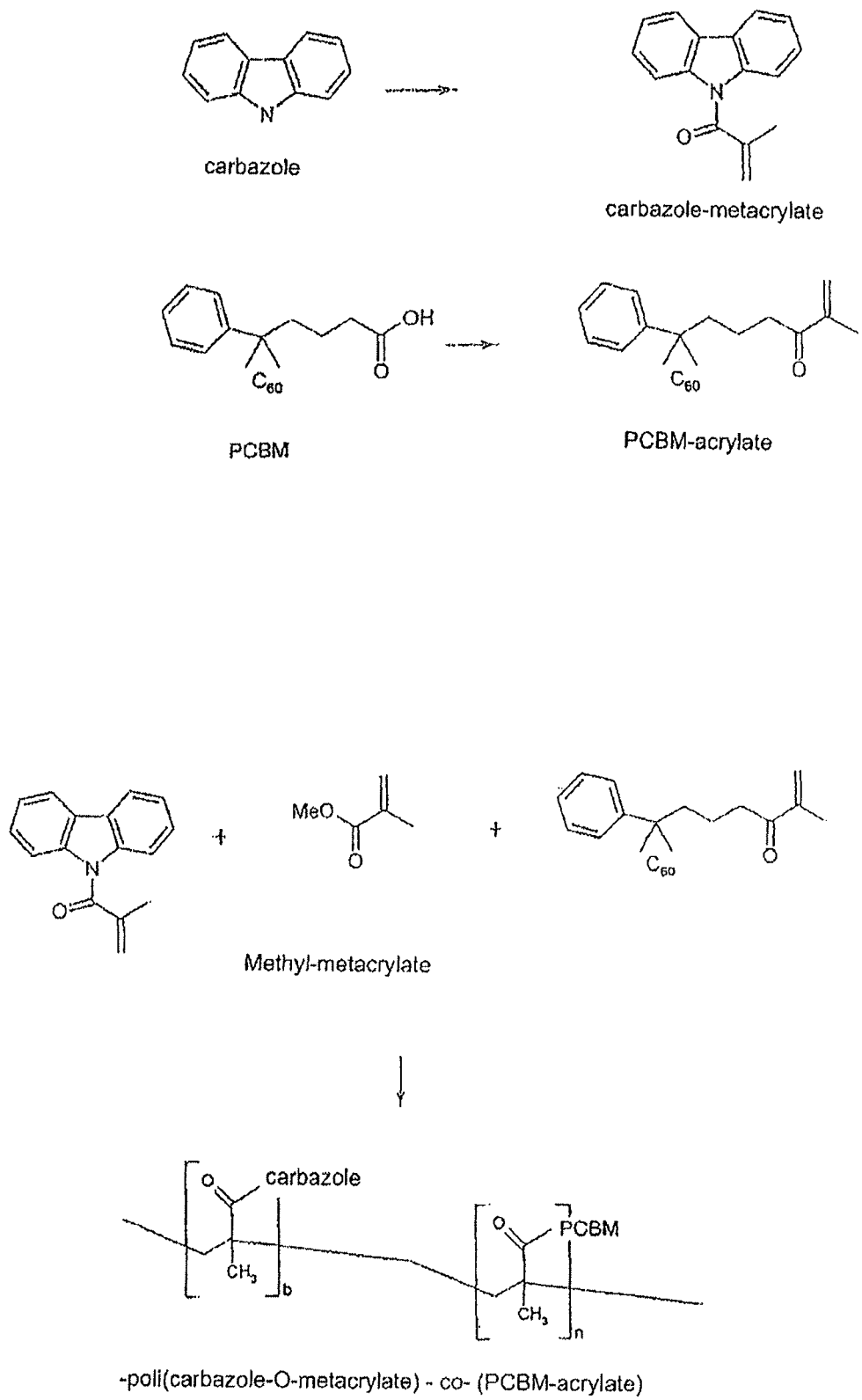
FIG. 9 shows a synthesis example for obtaining the active material schematized in FIG. 8.

An active material according to the present example can also be obtained with the synthesis strategy shown schematically in FIG. 9 in which PCBM and carbazole functionalized "ad-hoc" respectively with acrylate and methacrylate are made to react with a solution containing methylmethacrylate. From the polymerization of the comonomers, the desired system is obtained, that is in this case the poly(carbazole-O-methacrylate)-co-(PCBM-acrylate).

Functionalized polymers DA according to FIG. 8A can also be obtained with a mixture of cross-linkable polymers/oligomers which contain side-chain maleimide groups and species A and D functionalized with maleic, succinic or maleimide anhydride. This mixture undergoes photo-cross-linking with UV exposure.

Electron-attractor and electron-donor groups functionalized with maleic or succinic anhydride, for example N-1-pyrenil maleimide as electron-donor species and succinic derivatives of trinitrofluorenone as electron-acceptor species, can react by means molecular grafting reaction with photo-sensitive polymers which contain nucleophilic groups as —NH2 type groups (example of FIG. 8C).

According to a further example, the photo-sensitive active material is composed of photo-active polymers with pendant molecules which are all together capable of giving rise to charge transfer reactions.

In practice, in such case a photo-sensitive polymer is used having pendant groups which, with the polymer itself, give rise to charge transfer reactions.

Polymers functionalized in such a manner can be obtained as reported below, and as illustrated in FIGS. 10A-C in which the synthesis is schematized for obtaining the active material according to the present example, in which a photoresist polymer contains electron-donor (or acceptor) groups covalently bonded to the polymer skeleton having electron-acceptor (or donor) character:

by means of chemical synthesis, then by polymerization of monomers functionalized with the selected molecules—FIG. 10A;

by self-assembly between the polymer skeleton and the molecule itself—FIG. 10B;

by grafting following the synthesis of the polymer chain—FIG. 10C.

The molecular groups bonded to the polymer chain must be chosen such to give rise to charge transfer phenomena between the molecule and the polymer chain under the action of an electric potential.

According to a further example, the photo-sensitive active material is composed of photo-active polymers with electro-bistable molecules along the chain.

In practice, in such case is used a photo-sensitive polymer with molecular or functional groups along the polymer chain (i.e., comprised between, and bonded in a covalent manner to, portions of chain) which confer electro-bistable characteristics to the polymer when a voltage is applied.

Figure 11A:
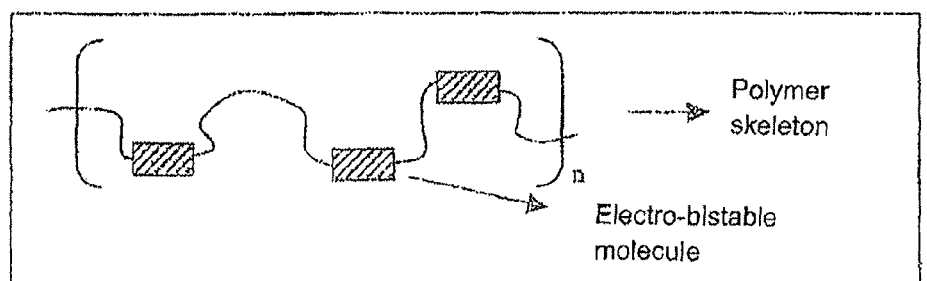
FIGS. 11A-11B show a diagram of a further variant embodiment of an active material and a related example.

FIG. 11A shows a diagram of an active material according to the present example in which a photoresist polymer contains electro-bistable molecular or functional groups along the chain.

Figure 11B:
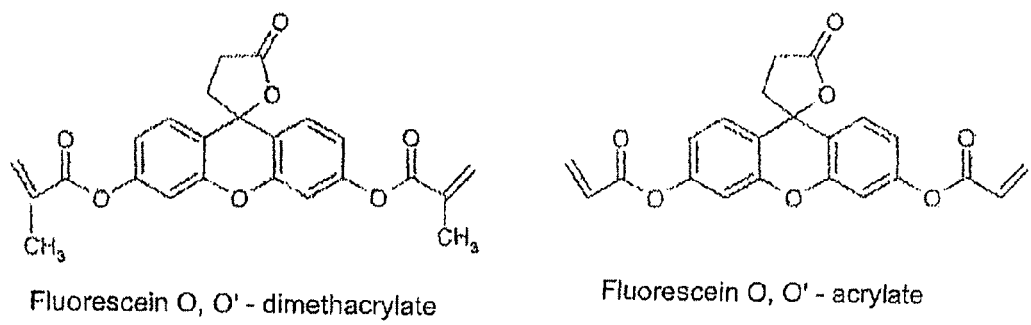

Examples of polymers with intra-chain electro-bistable groups comprise: derivatives of PMMA copolymerized with fluorescein or dimethacrylated or acrylated derivatives, as shown in FIG. 11B.

After all, it is useful to stress that the photo-sensitive active material utilized comprises a polymer species (related monomers or oligomers included), at least a portion of which is photo-sensitive and here defined, as previously reported, as a first structural portion, and a second structurally active or activatable portion in the above-considered sense, which according to the cases is composed of a different portion of the polymer species, or of molecular or functional groups covalently bonded to the polymer species, or of molecules dispersed in the polymer matrix formed by such polymer species.

It is important that in the manufacture of the active material as considered here, the second structural portion (the electrically active or activatable portion), most of the time constituted by functional groups, molecular groups, or active molecules, does not absorb at the wavelength of the UV radiation capable of activating the photo-polymerization or photo-degradation processes of the first structural portion, which is instead always of polymer nature.

Finally, it should be added that the photo-sensitive active material preferably shows also good chemical strength with respect to the used etching solvents; this in particular must be true for the high molecular weight component, i.e., the photo-cross-linked component in negative lithography or the base polymer mixture in positive lithography.

Moreover, the photo-sensitive active material shows good adhesion properties to the particular substrate in which it is deposited, and good film-forming properties that is it must adapt well to the underlying topography and a viscosity, to be experimentally optimized, facilitating the deposition of its mixture and ensuring a good dispersion of the molecules possibly dissolved therein.

In substance, the method permits the manufacture of electronic devices of organic (polymer) nature by using conventional photolithography techniques, without making any modification to the steps provided in the use of such technique while reducing their number, i.e., the need to make several intermediate steps.

Conventional photolithography permits to obtain, with appropriate polymer mixtures, the photoresists, highly precise and reproducible patterned structures (i.e., designed and modeled according to a predetermined geometry), whose resolution depends to the nature of the utilized source.

The photoresists are sacrificial elements which serve to build, by means of growth techniques such as epitaxy, the desired geometries (designs). In other words, the patterned photoresists constitute a medium, obtained by means of conventional photolithography, which in turn is used to make the desired architectures; upon architecture attainment, however, such medium is not comprised therein, since it is a sacrificial element.

In one embodiment, instead, the patterned structures made by using the photo-sensitive active material as considered here in place of the common photoresist, themselves become active elements of organic devices (memory type, or TFT) with defined geometry.

Hence a main advantage is represented by the possibility to make organic-based circuit architectures, with particular reference to the non-conventional memories and in any case circuit architectures with structures of any type of complexity by using the traditional photolithography but reducing its number of steps, and therefore reducing its costs and manufacturing time.

Currently, the techniques for obtaining patterned organic polymer film (designed according to the desired geometry) are inkjet printing and soft-lithography.

One embodiment instead permits creating electrically active and patterned polymer films by utilizing conventional photolithographic techniques.

Advantageously, it should be noted that many of the polymers and monomers indicated are commercial, hence they are easily available and inexpensive.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   manufacturing an organic-based circuit architecture, the manufacturing including:
      forming a first electrode;
      depositing, on said first electrode, a first active material film that includes:
         a first structural portion having a first absorption peak at a first UV wavelength, said first structural portion being photo-activatable at said first UV wavelength, and
         an electrically activatable second structural portion which is substantially transparent to said UV first wavelength;
      photo-activating a first portion of said first active material film, the photo-activating including exposing the first portion through a photomask to a first UV radiation having said first UV wavelength, the first active material film also including a non-exposed second portion protected from the first UV radiation by the photomask;

exposing a portion of said first electrode by treating said first active material film with an first agent;

selectively removing one of the portions of said first active material film, either the exposed first portion or the non-exposed second portion; and forming a second electrode on non-removed portions of the first active material film.

2. The method according to claim 1, wherein forming the first electrode includes forming said first electrode on a substrate and the manufacturing further comprises:

exposing portions of the substrate after one of the portions of the first active material film is selectively removed;

depositing a first dielectric material on the non-removed portions of said first active material film and on the exposed portions of the substrate; and selective exposing said non-removed portions of said first active material film by treating said first dielectric material with a second agent; and selectively removing a portion of the first dielectric material.

3. The method according to claim 1, wherein the manufacturing includes:

forming a crossbar architecture, the forming of the crossbar architecture including:

forming the first electrode in a first array of a plurality of first electrodes, the plurality of first electrodes being substantially parallel and spaced-apart from each other; and forming the second electrode in a second array of a plurality of second electrodes, the plurality of second electrodes being substantially parallel and spaced-apart from each other, the second array of second electrodes being substantially orthogonal to the first array of first electrodes.

4. The method according to claim 3, further comprising:

forming a multilayer architecture, the forming including:

depositing a second active material film after forming the second array of the second electrodes, the second active material film including a first structural portion having a second absorption peak at a second UV wavelength, said first structural portion being photo-activatable at said second UV wavelength, and an electrically activatable second structural portion which is substantially transparent to said second UV wavelength;

exposing a first portion of said second active material film to a second UV radiation having the second UV wavelength, to photo-activate said exposed first portion of said the second active material film, the second active material film also including a non-exposed second portion protected from the second UV radiation;

exposing portions of the second electrodes by selectively removing one of the portions of the second active material film;

depositing a second dielectric material on non-removed portions of said second active material film and on the exposed portions of said second electrodes;

exposing the non-removed portions of the second active material film by selectively removing the second dielectric material; and forming a third array of third electrodes on the non-removed portions of the second active material film, the third electrodes being parallel to each other and orthogonal to the second electrodes.

5. The method according to claim 1, wherein said first and second electrodes are deposited through a photomask using one selected from the group consisting of thermal evaporation, sputter, microtransfer molding, and microcontact printing.

6. The method according to claim 1, wherein said first active material film is deposited using spin-coating or spin-casting.

7. The method according to claim 1 wherein the first structural portion forms an intrinsically electro-bistable polymer formed from one selected from the group consisting of a photo-polyerized monomer, a photo-polyerized oligomer, a photo-cross-linked monomer, a photo-cross-linked oligomer, and a photo-degraded polymer.

8. The method according to claim 7, wherein said first active material film is a derivative of polymethylmethacrylate (PMMA).

9. The method according to claim 8, wherein said derivative of PMMA is polymethylmethacrylate-co-9-anthracenyl-methylmethacrylate.

10. The method according to claim 1, wherein said first structural portion is a chemically inert matrix for said second structural portion dispersed therein, and in which said second structural portion includes electro-bistable molecules.

11. The method according to claim 7 wherein the polymer is formed from one selected from the group consisting of side-chain maleimide groups, azidoaryl groups, a photoresist, or formed on an acrylic, methacrylic, or ether vinyl base containing optionally substituted side-chain chalcone groups.

12. The method according to claim 10, wherein said electro-bistable molecules are chosen from the group consisting of fluorescein and its derivatives, DDQ (2,3-dichloro-5,6dicyano-p-benzoquinone), DDME (1,1-dicyano-2,2-(4-dimethyl aminophenyl) ethylene), Ni-Pc (nickel (II) phthalocyanine tetrasulfonic acid tetrasodium), AIDCN (2-amino-4, 5imidazole dicarbonitrile), DMNDPA (N,N-dimethyl-N-(3-nitrobenzylidene)-p- phenylenediamine).

13. The method according to claim 7 wherein said first structural portion is a chemically inert matrix for said second structural portion dispersed therein, and in which said second structural portion comprises at least two molecular species, having respectively electron-acceptor character and electron-donor character, said at least two molecular species generating a charge transfer system.

14. The method according to claim 13, wherein the polymer is formed from one selected from the group consisting of side-chain maleimide groups, azidoaryl groups, a photoresist or formed on an acrylic, methacrylic, or ether vinyl base containing optionally substituted side-chain chalcone groups.

15. The method according to claim 1, wherein said second structural portion is dispersed in said first structural portion, with said structural portions having one being an electron-acceptor character, and the other an electron-donor character, said structural portions constituting a charge transfer system.

16. The method according to claim 15, wherein said first structural portion includes a photoresist.

17. The method according to claim 15, wherein said charge transfer system includes fullerene-C60 dispersed in a copolymer selected from the group consisting of tetrathiafulvalene (TTF) and poly(chloromethylstyrene (PSTFF), and polymethylmethacrylate and co-9- anthracenylmethylmethacrylate.

18. The method according to claim 1, wherein said second structural portion includes an electro-bistable molecular or functional groups chemically bonded, as pendant groups, to said first structural portion.

19. The method according to claim 18, wherein said first structural portion includes acrylated polymer, methacrylated polymers, acrylated monomers, or methacrylated monomers.

20. The method according to claim 18, wherein said electro-bistable molecular or functional groups include fluorescein or fluorescein derivatives.

21. The method according to claim 7, wherein said second structural portion includes at least two different molecular or functional groups chemically bonded, as pendant groups, to said first structural portion, with said at least two different molecular or functional groups having one with an electron-acceptor character, and another with an electron-donor character, said at least two different molecular or functional groups constituting a charge transfer system.

22. The method according to claim 21, wherein the polymer of said first structural portion is selected from the group consisting of a methacrylated polymer, a methacrylated monomers, a polymer containing side-chain maleimide groups, and an oligomer containing side-chain maleimide groups.

23. The method according to claim 21, wherein said charge transfer system comprises PCBM and carbazole.

24. The method according to claim 1, wherein said second structural portion includes molecular or functional groups chemically bonded, and grafted as pendant groups, to said first structural portion, with said structural portions having one group of an electron-acceptor character, and another of an electron-donor character, said structural portions constituting a charge transfer system.

25. The method according to claim 1, wherein said second structural portion includes electro-bistable molecular or functional groups chemically bonded along said first structural portion.

26. The method of claim 7 wherein the polymer is formed from one selected from the group consisting of polymethylmethacrylate, fluorinated polymethylmethacrylate, oximine polymethylmethacrylate, and a photoresist.

27. The method of claim 13 wherein the polymer is formed from one selected from the group consisting of polymethylmethacrylate, fluorinated polymethylmethacrylate, oximine polymethylmethacrylate, and a photoresist.

28. A method, comprising:
forming an organic-based device, the forming including:
  forming a first electrode;
  forming an active material on the first electrode, the active material having a first structural portion that is a photo-active polymer configured to react to a UV wavelength and a second structural portion that is transparent to the UV wavelength, the second structural portion being electrically bi-stable; and
  forming a second electrode on the active material, the active material in contact with, and interposed between, the first and second electrodes.

29. The method of claim 28, further comprising:
selectively applying the UV wavelength to exposed portions of the active material through a mask;
removing the exposed portions of the active material to form a memory element on the first electrode;
forming a dielectric layer adjacent to sides of the memory element; and
forming the second electrode on the memory element.

30. The method of claim 28, further comprising:
forming a plurality of memory cells in the organic-based device, the forming of the memory cells including:
  forming a plurality of first electrodes while forming the first electrode;
  selectively applying the UV wavelength to exposed portions of the active material through a mask, the mask having a plurality of openings defining the plurality of memory cells;
  removing portions of the active material to form a plurality of memory elements on the first electrodes; and
  forming a plurality of second electrodes while forming the second electrode on the plurality of memory elements.

31. The method of claim 30, further comprising:
forming the plurality of memory elements in an array, the forming including:
  forming the plurality of first electrodes spaced apart from and parallel to each other;
  forming the plurality of memory elements on the first electrodes, the memory elements spaced apart from each other on the first electrodes; and
  forming the plurality of second electrodes spaced apart from and parallel to each other, the second electrodes being orthogonal to the first electrodes.

* * * * *